United States Patent
Guo

(10) Patent No.: US 10,340,166 B2
(45) Date of Patent: Jul. 2, 2019

(54) SUBSTRATES HANDLING IN A DEPOSITION SYSTEM

(71) Applicant: George Xinsheng Guo, Palo Alto, CA (US)

(72) Inventor: George Xinsheng Guo, Palo Alto, CA (US)

( * ) Notice: Subject to any disclaimer, the term of this patent is extended or adjusted under 35 U.S.C. 154(b) by 559 days.

(21) Appl. No.: 14/948,381

(22) Filed: Nov. 22, 2015

(65) Prior Publication Data
US 2017/0144186 A1    May 25, 2017

(51) Int. Cl.
*H01L 21/673*    (2006.01)
*H05K 13/00*    (2006.01)

(52) U.S. Cl.
CPC .. *H01L 21/67346* (2013.01); *H01L 21/67309* (2013.01); *H01L 21/67383* (2013.01); *H05K 13/0061* (2013.01)

(58) Field of Classification Search
CPC ............. Y10S 269/903; B23K 3/087; H05K 13/0061–0069; H01L 21/687; H01L 21/68728; Y10T 24/44658
See application file for complete search history.

(56) References Cited

U.S. PATENT DOCUMENTS

| | | | | |
|---|---|---|---|---|
| 1,996,447 A * | 4/1935 | Warager | .................. | D06F 55/00 24/457 |
| 3,028,949 A * | 4/1962 | Sohosky | .................. | A45C 1/10 206/0.83 |
| 3,824,176 A * | 7/1974 | Crowe | ..................... | C25D 1/00 204/297.05 |
| 3,826,483 A * | 7/1974 | Siegel | ....................... | B25B 5/06 269/203 |
| 4,174,262 A * | 11/1979 | van Mellaert | ......... | C25D 17/06 204/291 |
| 4,582,245 A * | 4/1986 | Cartwright | ........ | H01L 21/67126 228/180.21 |
| 4,678,169 A * | 7/1987 | Fishman | .............. | H05K 3/0085 118/503 |
| 4,759,488 A * | 7/1988 | Robinson | ............... | B23K 3/087 228/43 |
| 5,103,976 A * | 4/1992 | Murphy | ............ | H01L 21/67333 206/509 |
| 5,318,212 A * | 6/1994 | Becker | ................... | B23K 3/087 228/44.7 |
| 7,051,408 B2 * | 5/2006 | De Azevedo | ........... | F16B 2/241 24/289 |
| 7,172,184 B2 * | 2/2007 | Pavani | .................... | C25D 17/08 204/297.06 |
| 8,678,365 B2 * | 3/2014 | Hofmann | ............. | G01R 1/0425 269/287 |

* cited by examiner

*Primary Examiner* — Tyrone V Hall, Jr.

(57) ABSTRACT

The present invention describe a substrate handling system that exerts no or controllable external forces to hold substrates, does not contact front or back of the substrates, has minimum contact with side edge area of the substrate, can hold one or two substrate to each position, can be positioned in any orientation, and can be easily handled by human or robots. In the case that no deposition materials is desirable on the edge or sides of substrate, a self-aligned mask that can be attached to the substrate carrier is presented.

2 Claims, 24 Drawing Sheets

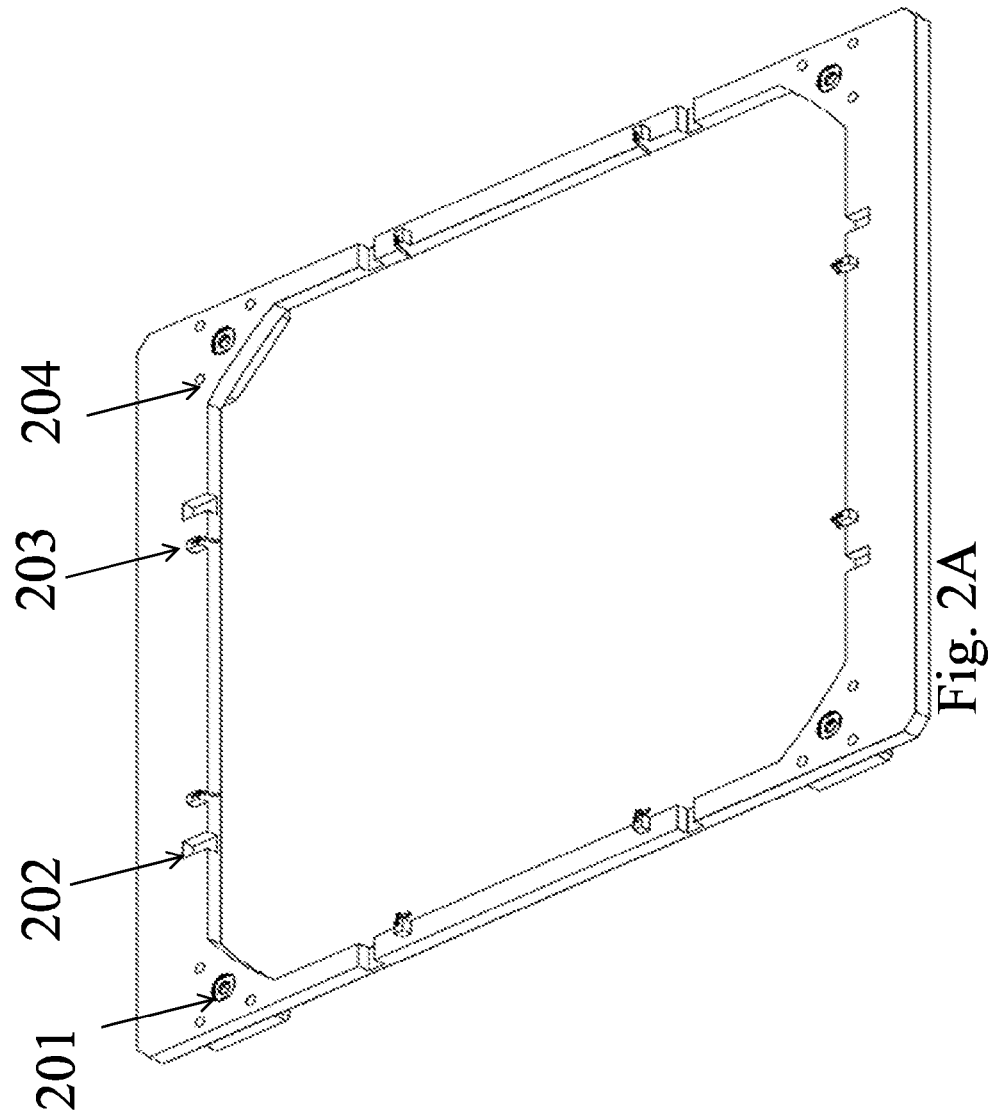

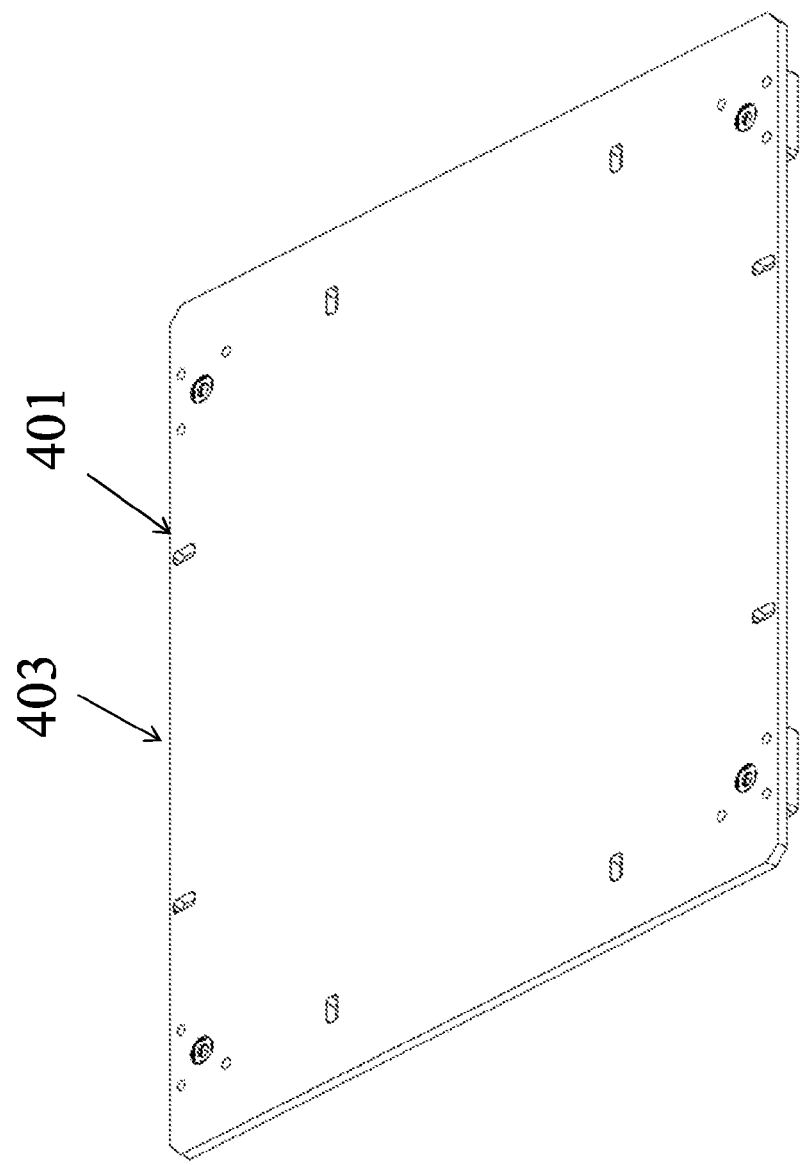

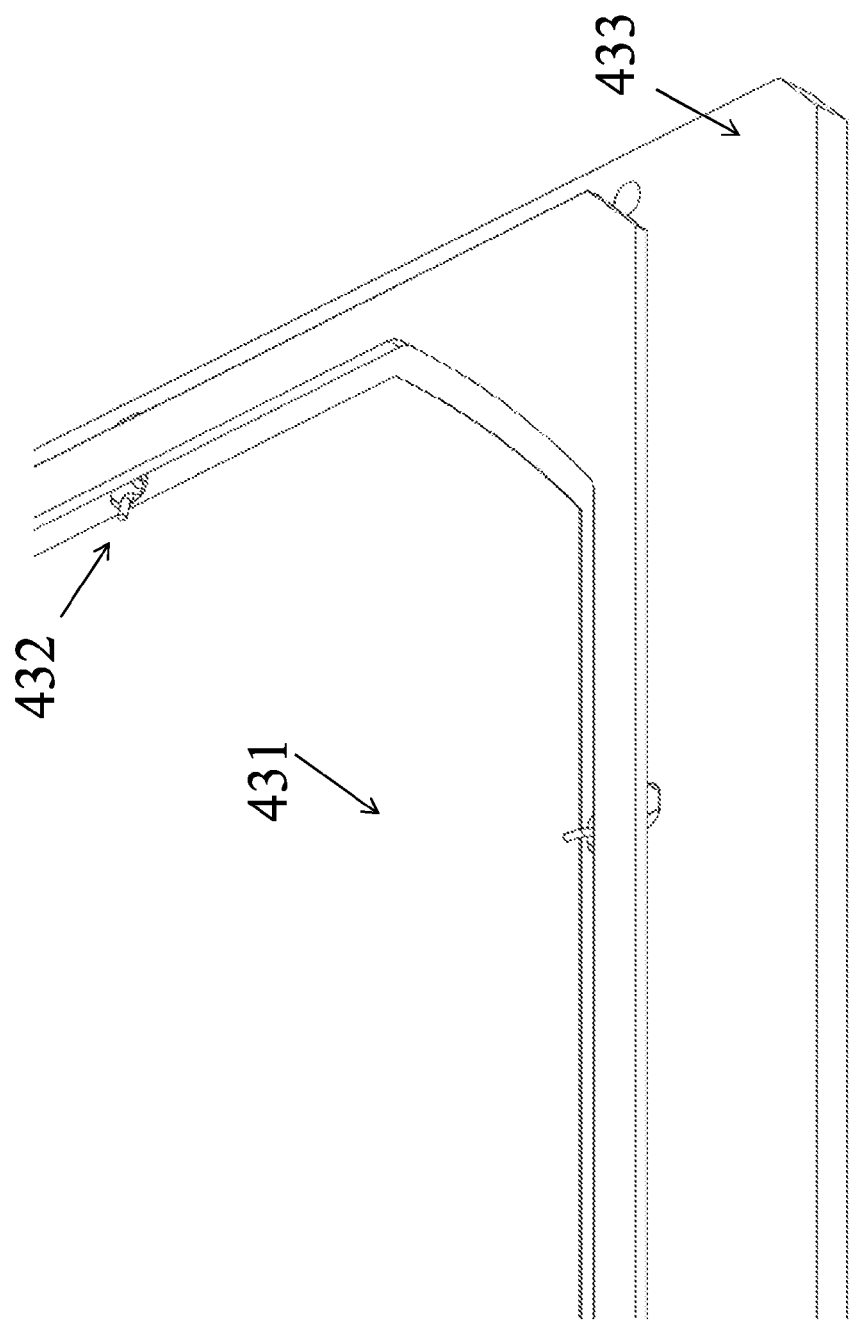

SUBSTRATES HANDLING IN A DEPOSITION SYSTEM

BACKGROUND OF THE INVENTION

This application relates to methods and apparatus for loading, holding, processing, and un-loading of substrates in deposition systems.

Methods and apparatus for loading, holding, processing, and un-loading of substrates in deposition systems are widely used in photovoltaic cells and panels, window glass coating, flat panel display manufacturing, coating on flexible substrates, hard disk coating, industrial surface coating, semiconductor wafer processing, and other applications.

Substrates are mounted to substrate carriers in some applications to increase the amount of substrates that can be processed at a time, or to accommodate the ways deposition equipment handle substrates.

It is necessary to hold the substrate without damaging the substrates; especially the substrates such as the silicon photovoltaic cells can be very thin and fragile. It is desirable to have no contact on the deposition side of the substrate to avoid shadowing of the deposition and particulates formation.

In some cases it is desirable to avoid deposition on edges and sides of substrate. Shadow masks are used in some cases. It is desirable to have low cost mask alignment system that can be easily implemented by robots. It is also desirable to load as many substrates to a given area. The substrate handling should be easily performed by either human or robots, including self-aligning and placement error correction. The substrate handling logistics should be simple and cost effective. The substrate handling system should accommodate all substrate mounting orientations relative to gravitational force.

SUMMARY OF THE INVENTION

The present invention describe a substrate handling system that exerts no or controllable external forces to hold substrates, does not contact front or back of the substrates, has minimum contact with side edge area of the substrate, can hold one or two substrate to each position, can be positioned in any orientation, and can be easily handled by human or robots. In the case that no deposition materials is desirable on the edge or sides of substrate, a self-aligned mask that can be attached to the substrate carrier is presented.

In some embodiments, the present invention describe a substrate handling system, comprising: a first planar panel with one or more openings, wherein the one or more openings has larger dimensions than one or more substrates, wherein the substrate is mounted on any of the one or more openings; a first sets of fingers amounted on top side of the first planar panel, wherein the first sets of fingers point away from the substrate at an angle from zero to 60 degrees relative to the first planar panel, wherein there is some space between the first sets of fingers and the depositing surface of the substrate; a second planar panel coupled to the first panel, wherein the second planar panel is situated over the one more substrates; and a second sets of fingers amounted on bottom side of the second planar panel, wherein the second sets of fingers point away from the substrate at an angle from zero to 60 degrees relative to the second planar panel, wherein the first sets of fingers and the second sets of fingers form a cage that confines the one more substrates.

In some embodiments, the present invention describe a substrate handling system, comprising: a first planar panel with one or more openings, wherein the one or more openings has larger dimensions than a first substrate and a second substrate, wherein the first substrate and the second substrate are mounted on any one of the one or more openings, wherein the first substrate and the second substrate are placed back to back; a first sets of fingers amounted on top side of the first planar panel, wherein the first sets of fingers point downwards at an angle relative to the first planar panel, wherein there is some space between the first sets of fingers and outer surface of the first substrate; a second planar panel coupled to the first panel, wherein the second planar panel is situated underneath the second substrate; and a second sets of fingers amounted on bottom side of the second planar panel, wherein the second sets of fingers point upwards at an angle relative to the second planar panel, wherein there is some space between the second sets of fingers and outer surface of the second substrate, wherein the first sets of fingers and the second sets of fingers form a cage that confines the first substrate and the second substrate.

In some embodiments, the present invention describe a substrate handling system, comprising: a first plate with one or more openings, wherein the first plate is configured to secure one or more substrates; a first sets of fingers amounted on the first plate, wherein the first sets of fingers point downwards at an angle relative to the first plate, wherein a first portion of the first sets of fingers have an angle from 60 to 90 degrees from the first plate to allow the one or more substrates to slide into position, wherein a second portion of the first sets of fingers have a smaller angle relative to the first plate, wherein the second portion of the first sets of fingers are configured to stop the one or more substrates. In some embodiment, the substrate handling system includes an angle on the second portion of the fingers that are 0 degree to 55 degrees relative to the first plate. In some embodiments, the substrate handling system includes the first sets of fingers mounted on top side of the first plate. In some embodiments, the substrate handling system comprises a second plate coupled to the first plate and a second sets of fingers attached to the second plate are placed over the first plate and are configured to guide and hold the one or more substrates to a final position. In some embodiments, the substrate handling system includes the first sets of fingers that are made of thin metal wires or stripes with flexibility.

In some embodiments, the present invention describe a substrate handling system, comprising: a lower plate configured to carrier one or more substrate; a top plate with one or more openings, wherein the top plate is configured to be self-aligned when pushed down and secure one or more substrates by a plurality of quick locking and releasing devices, wherein mating parts of the plurality of the quick locking and releasing devices are attached to the lower plate and the top plate respectively, wherein when the top plate is pressed against lower plate, guiding and mating parts of the plurality of the quick locking and releasing devices engage each other. In some embodiments, the present invention describes a substrate handling system, wherein the mating parts are Sew-on Snaps, used in cloths such as shirts.

In some embodiments, the present invention describe a substrate handling system, comprising: a first plate with one or more openings, wherein the first plate is configured to secure one or more substrates; and one or more slopes manufactured on edges of the one or more openings at an angle relative to the first plate, wherein the angle from 60 to 90 degrees from the top plate to allow the one or more substrates to slide into position, wherein the bottom of one or more slopes are configured to stop the one or more substrates. In some embodiments, the present invention describes the substrate handling system, wherein the angle is from 75 to 85 degrees. In some embodiments, the present invention describes the substrate handling system that further comprises a second plate coupled to the first plate and a second plate is configured to secure the substrates.

In some embodiments, the present invention describe a substrate handling system, comprising: a first plate with two or more openings, wherein the first plate is configured to hold one or more substrates; a first sets of fingers amounted on a second plate, wherein the first sets of fingers point towards the substrate at an angle relative to the second plate, wherein a first portion of the first sets of fingers have an angle from 60 to 90 degrees, or more likely from 75 to 85 degrees, from the second plate to allow the one or more substrates to slide into position, wherein a second portion of the first sets of fingers have a smaller angle relative to the second plate, wherein the second portion of the first sets of fingers are configured to secure the one or more substrates.

In some embodiments, the present invention describes the substrate handling system, wherein the fingers are made of thin metal wires or stripes with flexibility.

These and other aspects, their implementations and other features are described in details in the drawings, the description and the claims.

BRIEF DESCRIPTION OF THE DRAWINGS

FIG. 2A shows an example of the quick locking and releasing devices.

FIG. 4A shows a lower substrate carrier with recess area to accommodate fingers from top plate.

FIG. 4D shows a detailed view of top plate with fingers hold the substrate.

DETAILED DESCRIPTION OF THE INVENTION

Figure 1A:
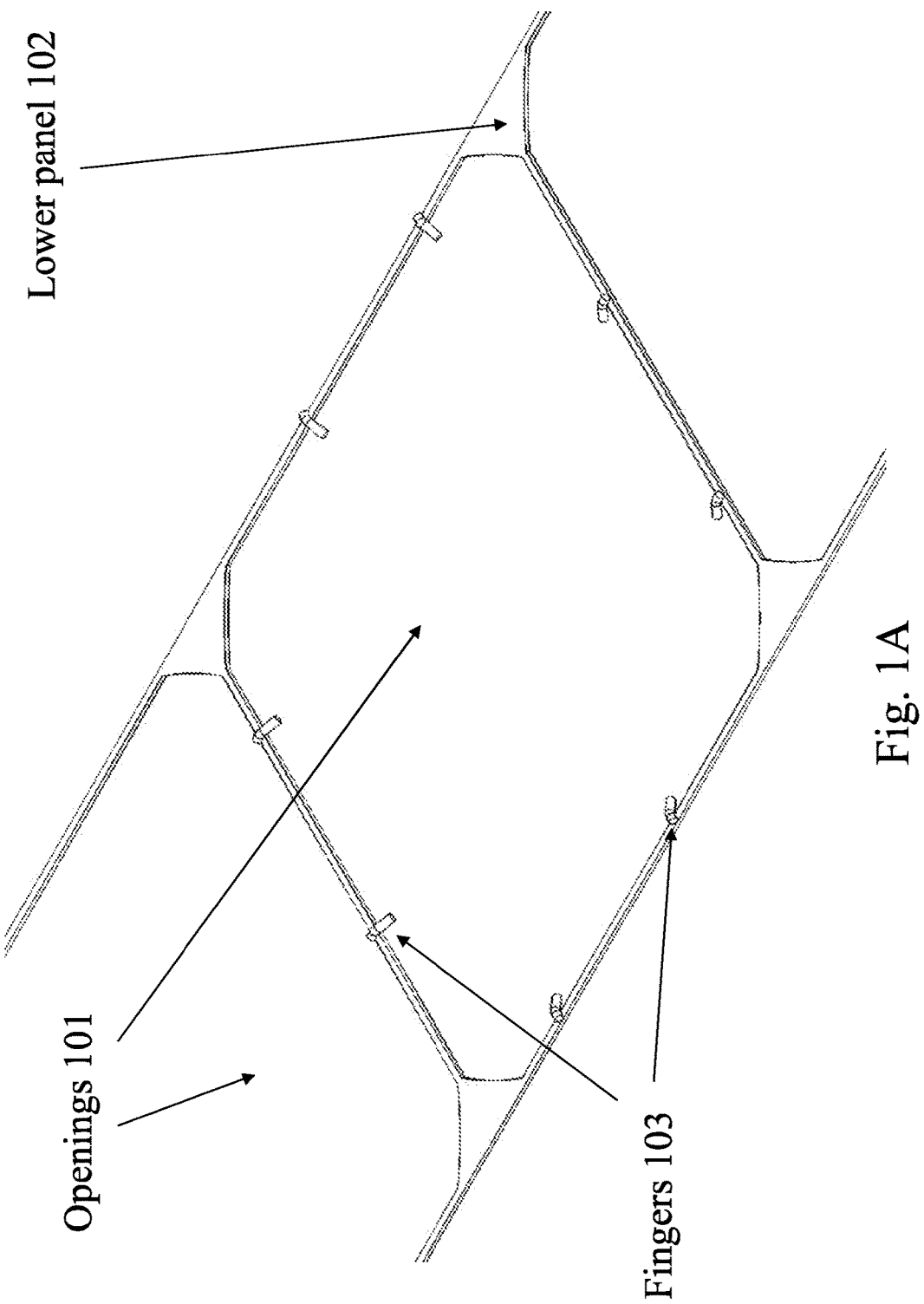
FIG. 1A shows that fingers such as wires, rods or plates are attached to a first planar panel with one or multiple openings that are larger than the substrate dimensions.

Fingers such as wires, stripes, rods or plates are attached to a first planar panel with one or multiple openings that are larger than the substrate dimensions in FIG. 1A. Opening 101 is within the lower panel 102. Fingers 103 are on the edge of opening 101.

Figure 1B:
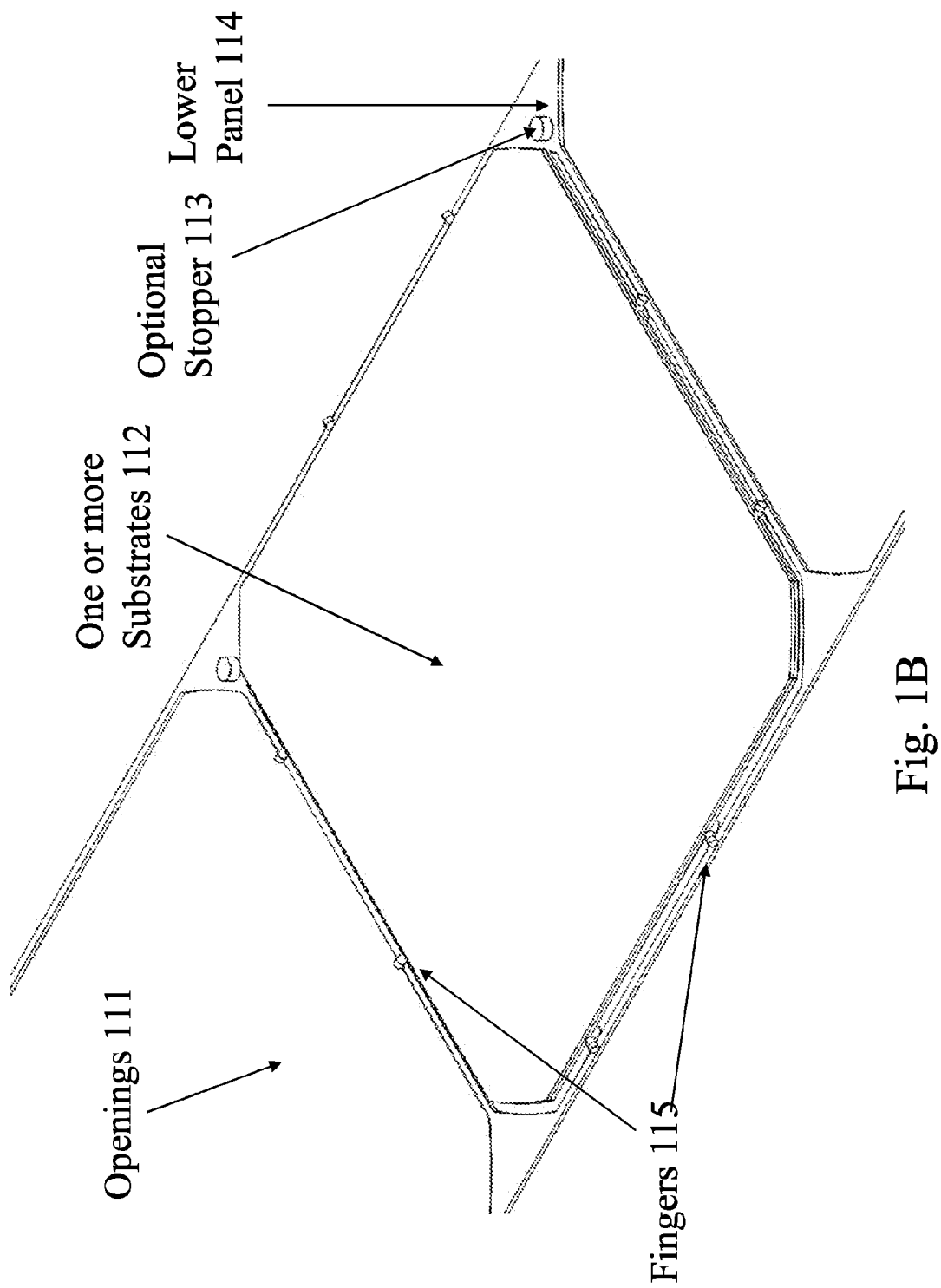
FIG. 1B shows substrates such as thin silicon photovoltaic cells, glass, silicon wafers, or other substrates are placed on these fingers mentioned in FIG. 1A.

Substrates such as thin silicon photovoltaic cells, glass, silicon wafers, or other substrates are placed on these fingers in FIG. 1B. One or two substrates 112 can be placed in each opening 111 of the lower panel 114 to coat single side of the single substrate, both sides of the single substrate, or outer sides of both substrates. The cell can be placed or removed using vacuum suction forces or other means by a picking and placing robots at high speed. The fingers 115 are mounted on top side of the first panel and are pointing downwards at an angle to avoid contacting the front surfaces of the substrates.

Figure 1C:
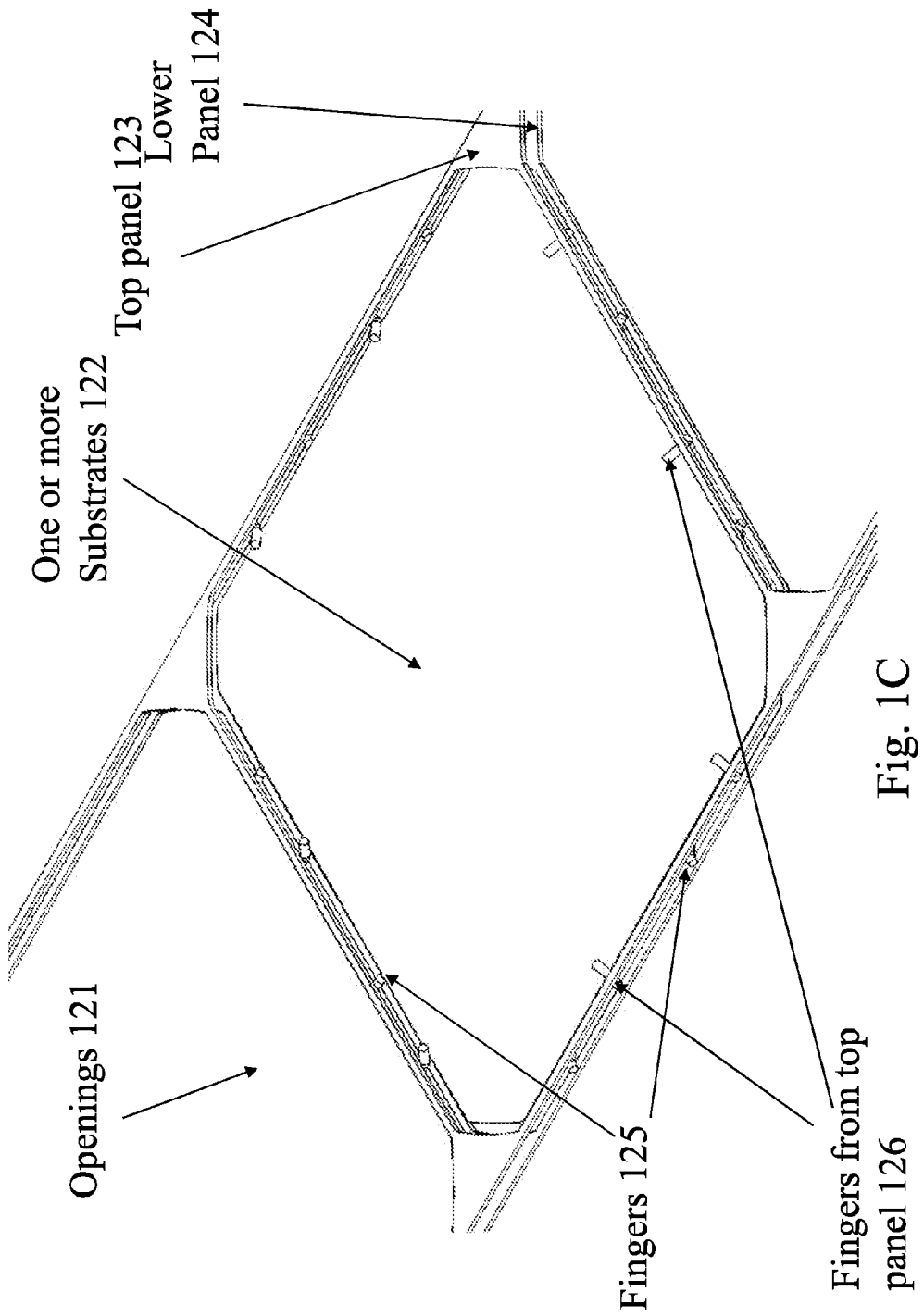
FIG. 1C shows a second panel with fingers mounted on bottom side of the panel and pointing upward at an angle are then placed over the first panel and the substrates and attached to the first panel through fasteners or clamps with spring force.

FIG. 1C shows that a top panel 123 with fingers 126 mounted on bottom side of the panel and pointing upward at an angle are then placed over the lower panel 124 and the substrates 122 and attached to the lower panel 124 through fasteners or clamps with spring force in FIG. 1C. The lower panel 124 also has fingers 125. The opening 121 is also in the system. The fingers 126 and 125 on the two panels are placed such as they don't interfere with each other and are not too close to each other to avoid excess searing forces. These fingers form a cage that confines the substrate or substrates placed back to back.

Figure 1D:
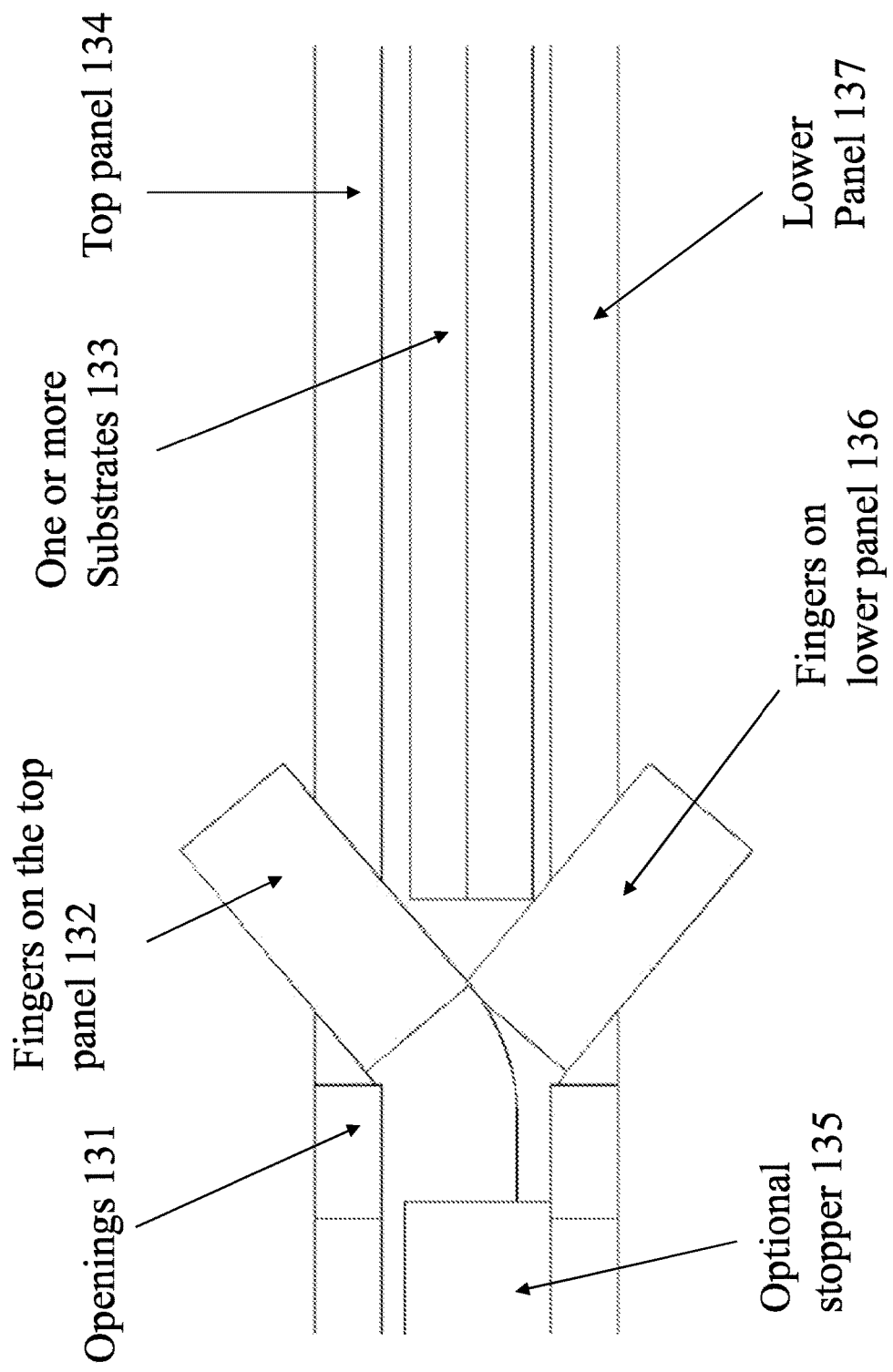
FIG. 1D shows the cross sectional view of the panels, fingers, and substrate before it is compressed together.

FIG. 1D shows the cross sectional view of the panels 134 and 137, fingers 132 and 136, and substrate 133 before it is compressed together. Fingers on the top panel 132 and Fingers on the lower panel 136 compressed together and secure the position of the substrate 133. The openings 131 are also in the system. The optional stopper 135 is attached to the fingers and to stop the movement of the substrate 133.

Figure 1E:
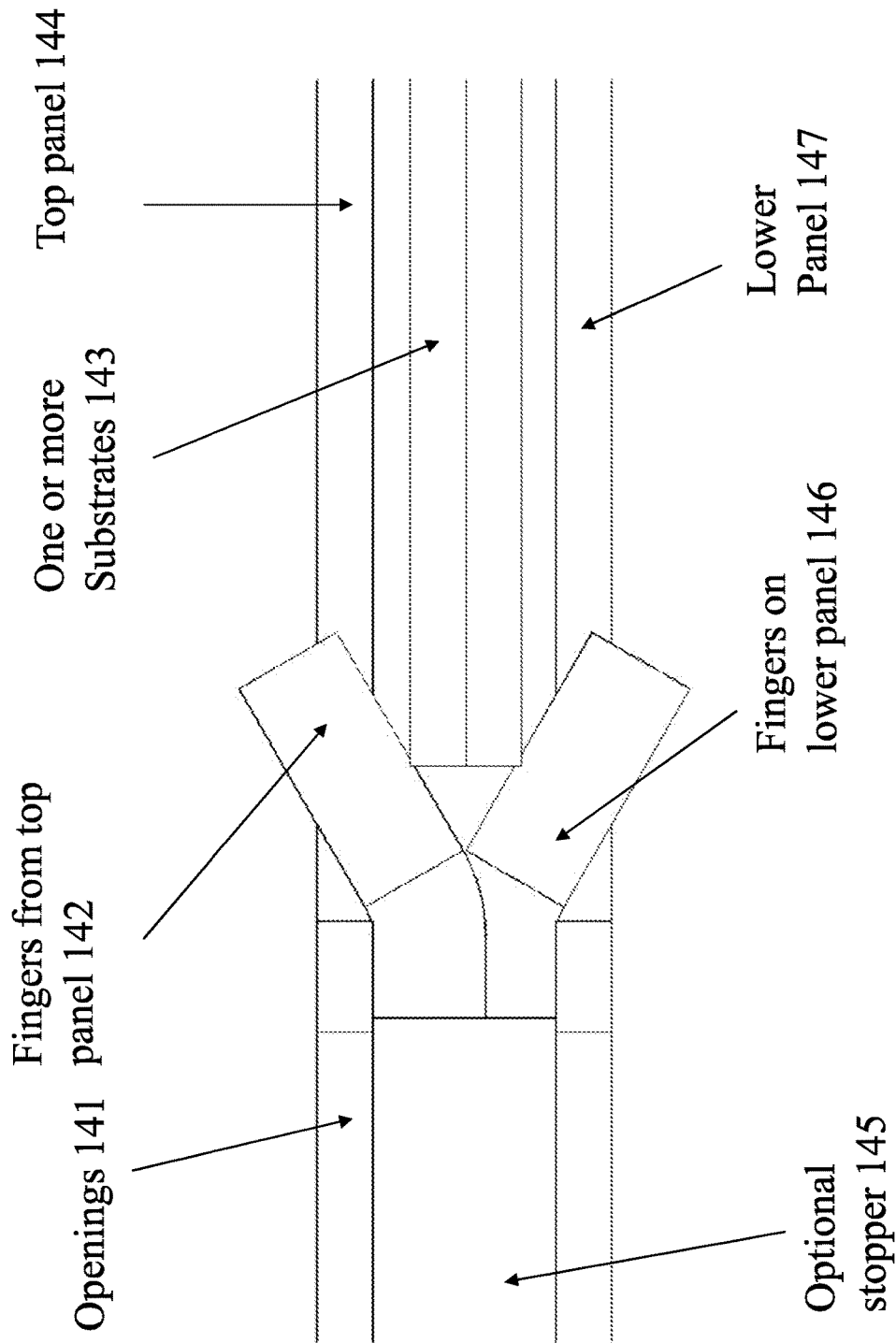
FIG. 1E shows the same cross section after it is compressed to the optional stopper.

FIG. 1E shows the same cross section after it is compressed to the optional stopper 145. Depending on the flexibility of the fingers 142 and 146, the bending angle of the fingers, diameter of the fingers, thickness of the substrates and the length of the fingers between the edge of opening in the panels 144 and 147 and to the edge of the substrates 143, the fingers can exert a small and controllable force to the substrate edge 143. The total holding force also depends on how many fingers are placed on each opening and can be controlled by incorporating spacers between first and second panel. In the case the cage is large enough that the substrate do not touch the fingers on the second panel when it is placed on top of the substrate, no external force other than gravity is applied to the substrate regardless of the substrate orientation. The present invention can reduce substrate breakage, and has minimum shadowing effect on substrates due to its small sizes.

The substrates such as photovoltaic cells, glass, silicon wafers, or other substrates are attached to a substrate carrier. The substrate can be either attached to carrier individually or placed back to back and then attached to carrier to reduce backside deposition and double the amount of substrates processed at a time.

When substrates are placed back to back, it not only doubles the amount of substrates that can be loaded, therefore increases the deposition tool productivity, but also avoid the deposition on the substrate backside without the need for additional substrate carriers or back shields, which not only add weight and cost, but also requires frequent cleanings. The minimized force on substrate is especially important for thin fragile silicon cells where the thickness is around 100 to 200 microns.

In some cases, it is desirable for the substrate to be positioned accurately and be confined to a location. It is also desirable to guide substrate to its final position even if there is placement error due to the robots or movement of substrates; the finger can have a steep angle so that the substrate can slide into position.

FIG. 2A shows the quick locking and releasing devices 202, 203 and 204 in the substrate loading system. In addition, part of Sew-on Snaps device 201 is also in the system.

Figure 2B:
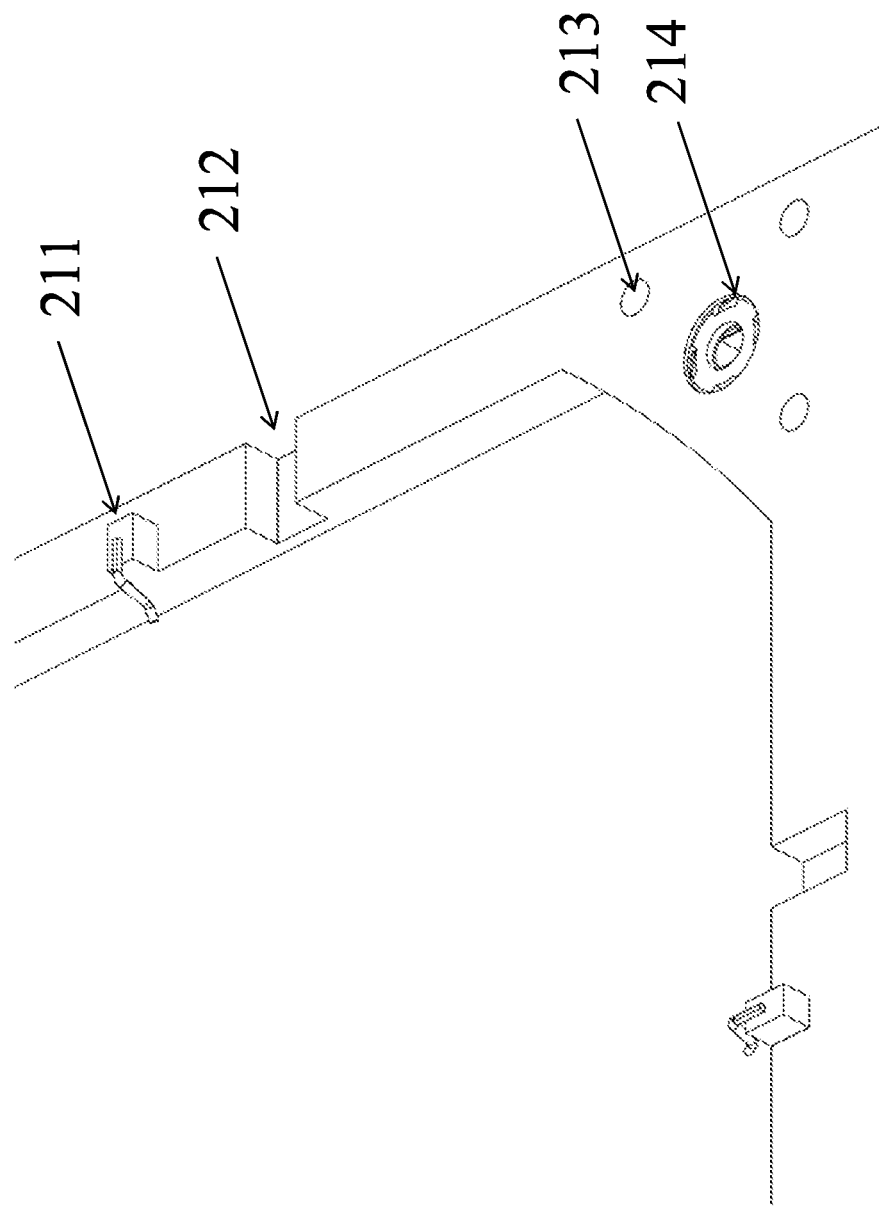
FIG. 2B shows another embodiment of the quick locking and releasing devices.

FIG. 2B shows another embodiment of the quick locking and releasing devices 211, 212 and 213 in the substrate loading system. In addition, part of Sew-on Snaps device 214 is also in the system.

Figure 2C:
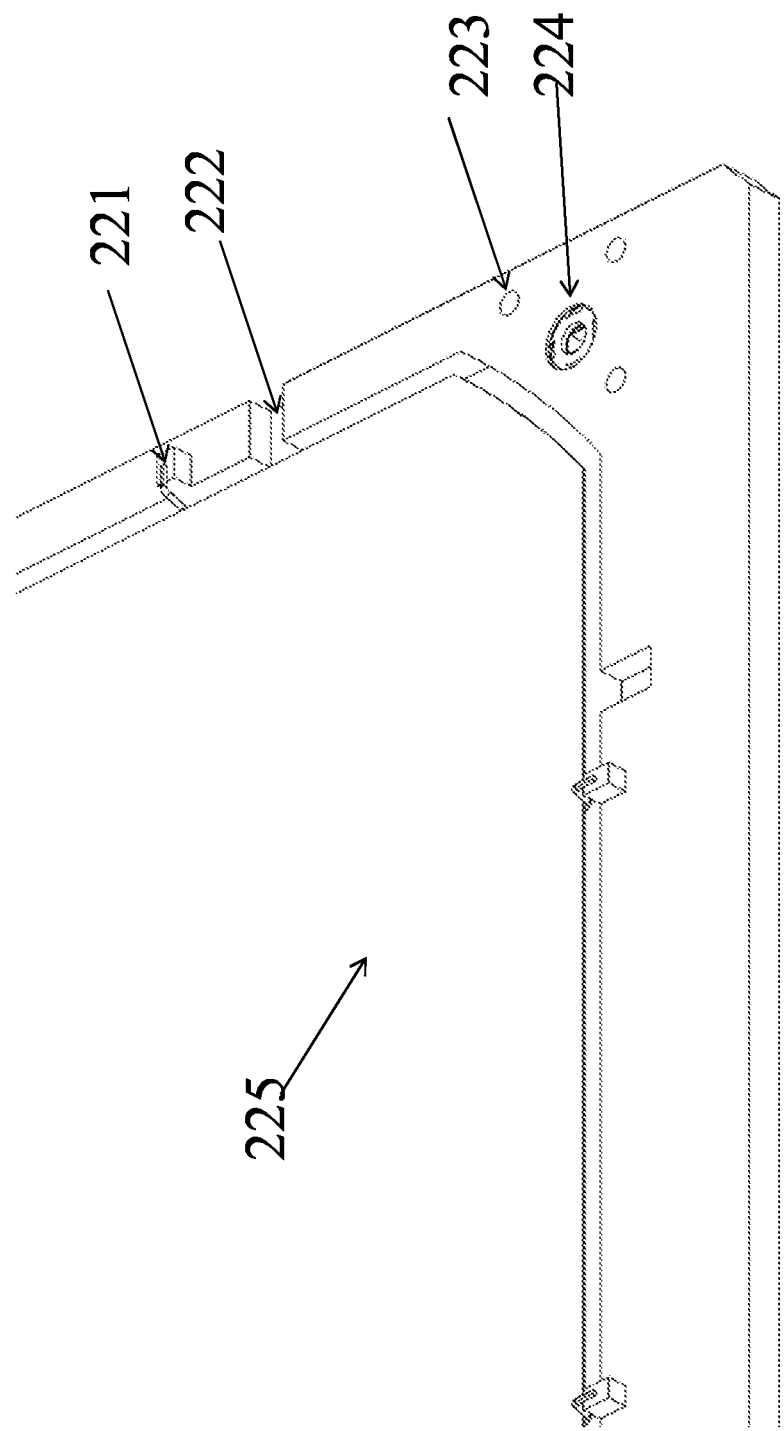
FIG. 2C shows another embodiment of the quick locking and releasing devices.

FIG. 2C shows another embodiment of the quick locking and releasing devices 221, 222 and 223 in the substrate loading system. In addition, part of Sew-on Snaps device 224 is also in the system. In this embodiment, a substrate 215 is already placed in the system.

FIGS. 2A to 2C show the fingers on lower plate of the substrate carrier and with one substrate or two substrates placed back to back on these fingers. The sliding angle can be 0 to 30 degrees relative to vertical direction, more commonly 5 to 20 degrees relative to vertical direction. When the substrate slide to the lowest position, in some cases aide by vibration of the substrate carrier, it is stopped by the portion of fingers that have large angles relative to vertical direction.

Figure 2D:
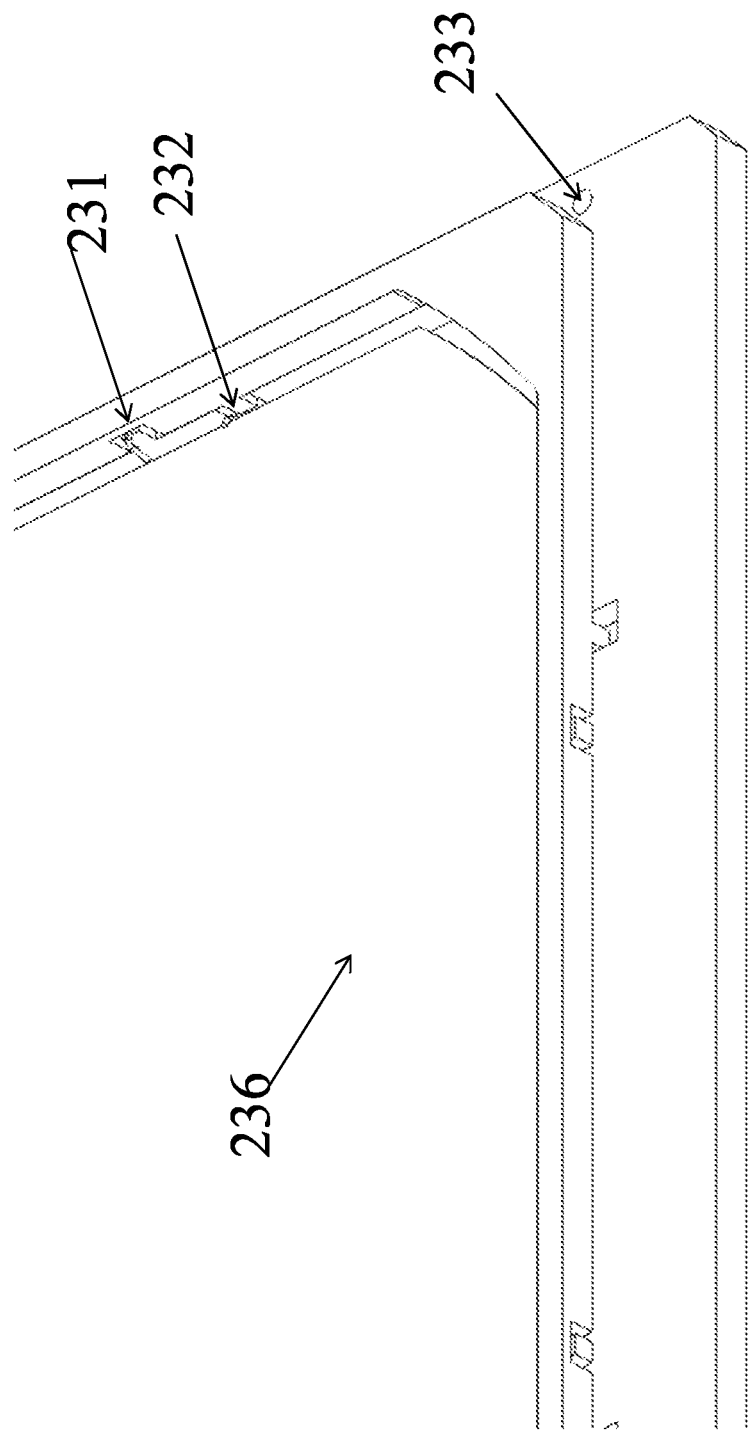
FIG. 2D shows another embodiment of the quick locking and releasing devices.

FIG. 2D shows another embodiment of the quick locking and releasing devices 231, 232 and 233 in the substrate loading system. Another set of fingers attached to a separate top plate 236 is placed over the lower substrate carrier and is being pushed down; further guiding the substrates to its final position, as shown in FIG. 2D.

Figure 2E:
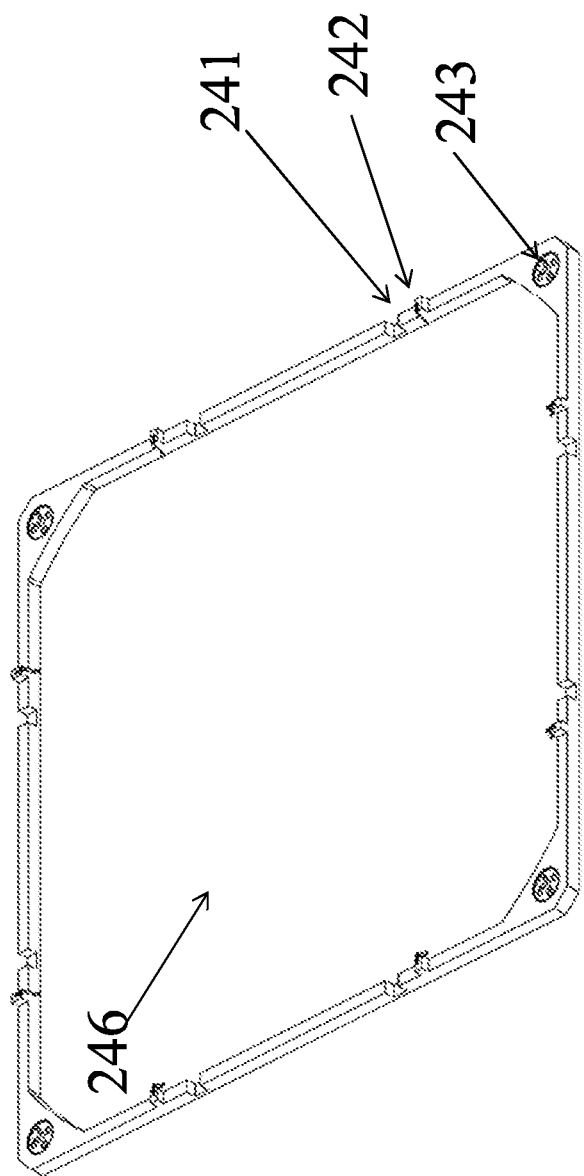
FIG. 2E shows another embodiment of the quick locking and releasing devices.
Figure 2F:
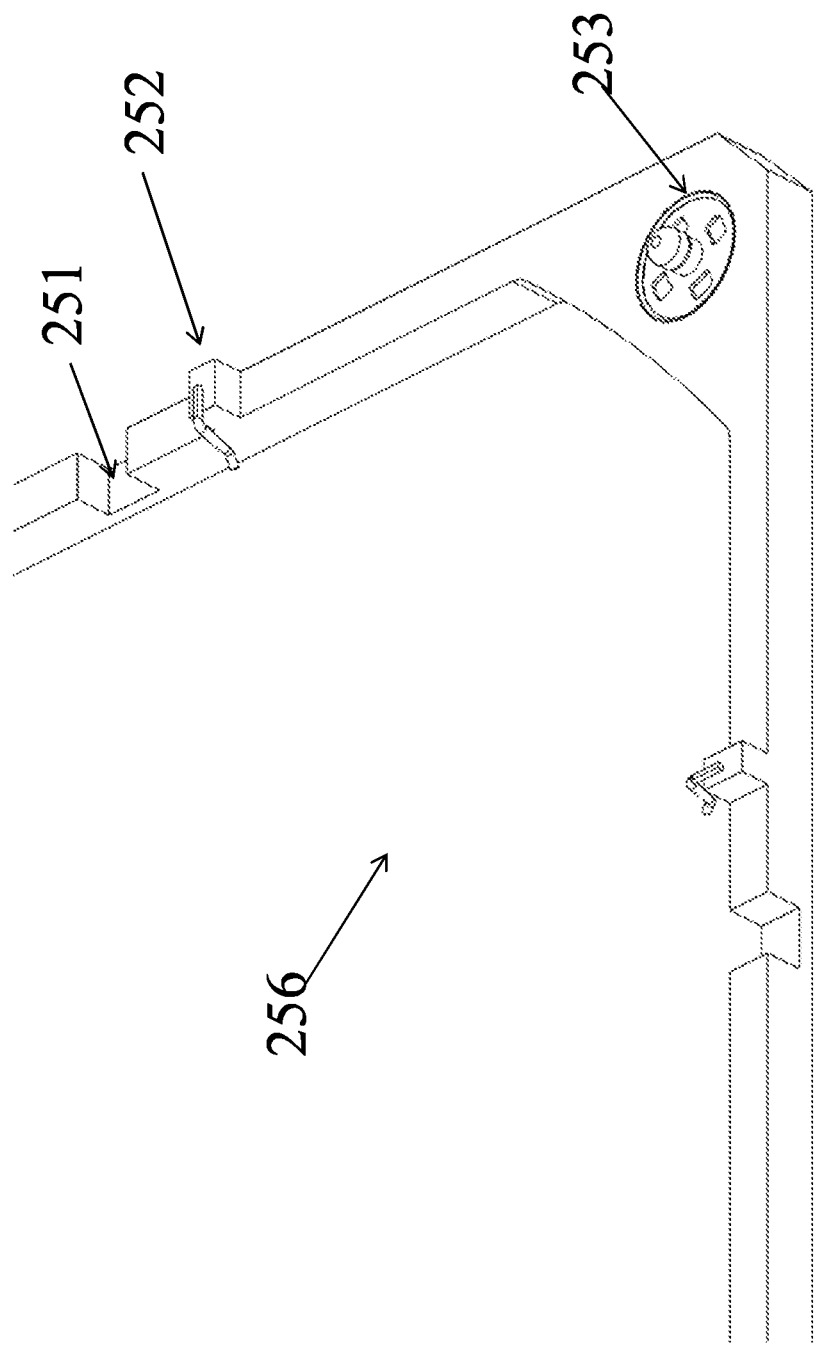
FIG. 2F shows another embodiment of the quick locking and releasing devices.

FIG. 2E shows another embodiment of the quick locking and releasing devices 241, 242 and 243 in the substrate loading system. FIG. 2F shows another embodiment of the quick locking and releasing devices 251, 252 and 253 in the substrate loading system. The top plate with fingers 246 is shown in FIG. 2E and the top plate with fingers 256 is shown FIG. 2F, viewed from the bottom side.

Figure 2G:
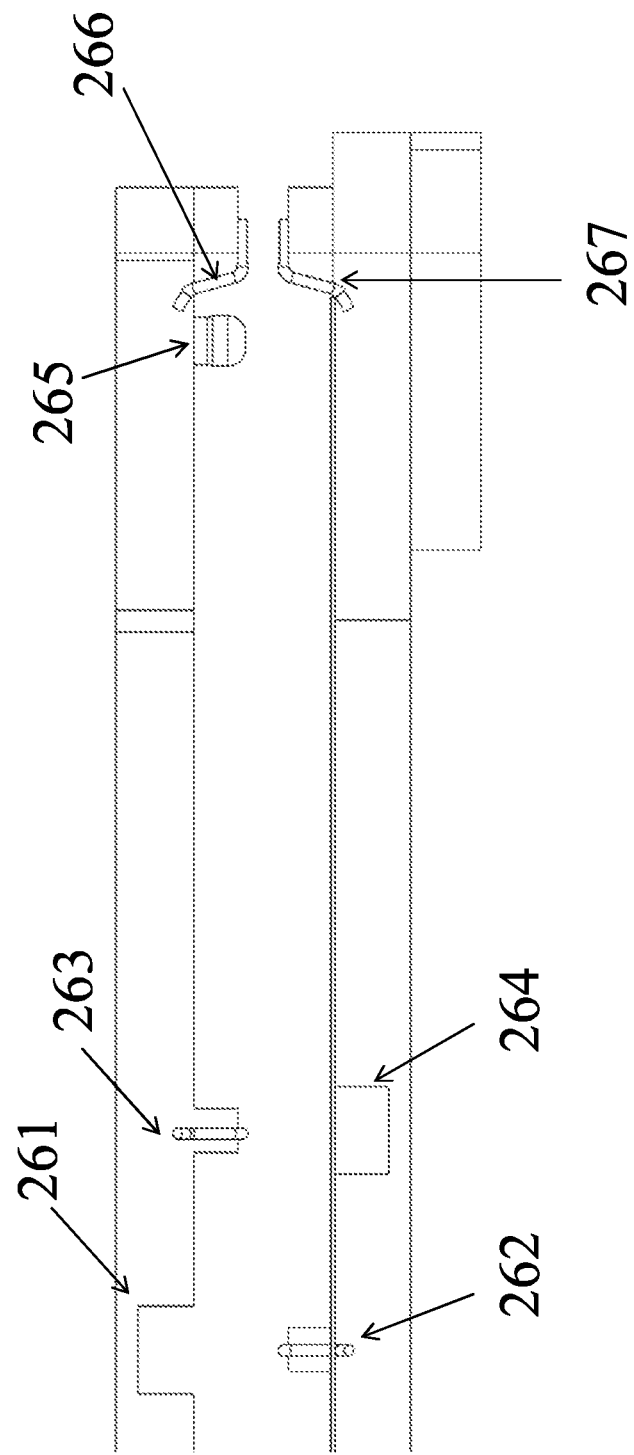
FIG. 2G shows the side views of the substrate on finger before the top plate is being pressed down.

FIG. 2G shows the side views of the substrate on finger before the top plate is being pressed down. There is a first pair of mating devices 261 and 262, a second pair of mating devices 263 and 264, a quick locking device 265 and two fingers 266 and 267.

Figure 2H:
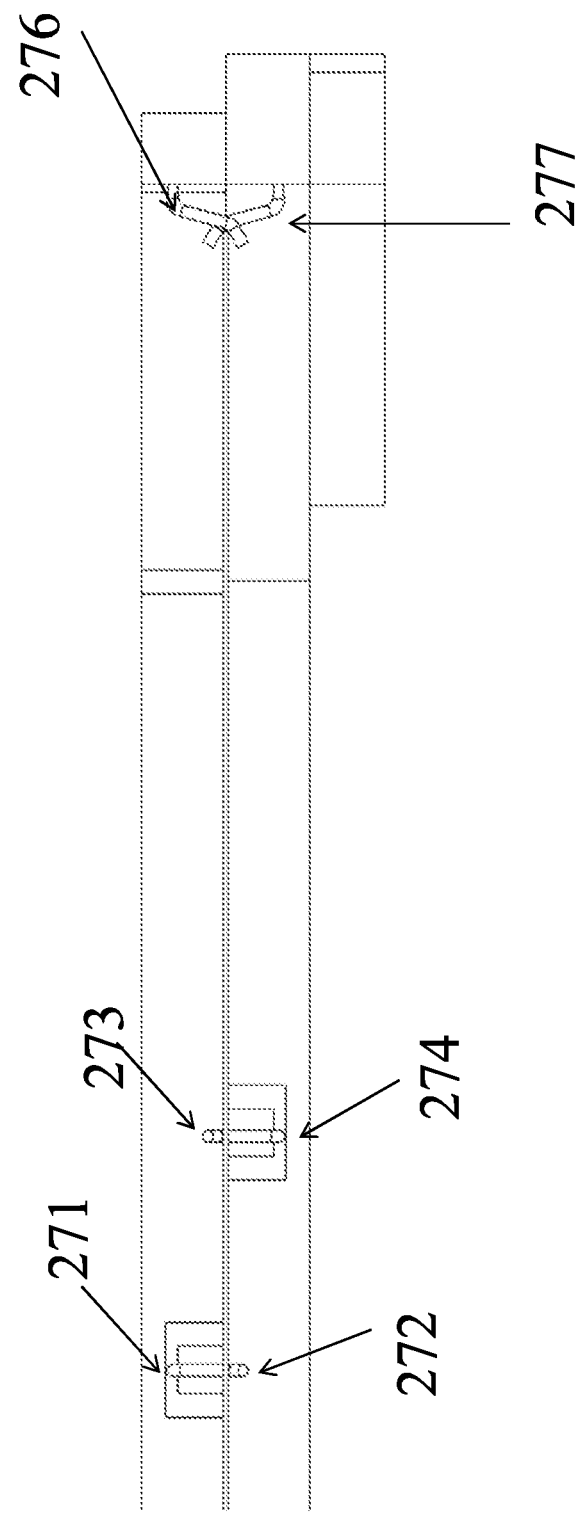
FIG. 2H shows the substrate confined by the fingers on top plate after the top plate is pressed down and engaged to the lower plate.

FIG. 2H shows the substrate confined by the fingers on top plate after the top plate is pressed down and engaged to the lower plate. Two substrates can be placed back to back in the substrate carrier. There is a first pair of mating devices 271 and 272, a second pair of mating devices 273 and 274, a quick locking device 275 and two fingers 276 and 277.

The top plate can be self-aligned and attached to the lower substrate carrier by a plurality of quick locking and releasing devices. One such device is the low cost Sew-on Snaps device. Refer to FIGS. 2A to 2C for the bottom plate and FIGS. 2E and 2F for top plate, the mating parts of the Sew-on Snaps device are attached to the top and bottom plates respectively. When the top plate is pressed against lower plate, these Sew-on Snaps device self-align and engage each other, as shown in FIGS. 2I and 2J.

Figure 2I:
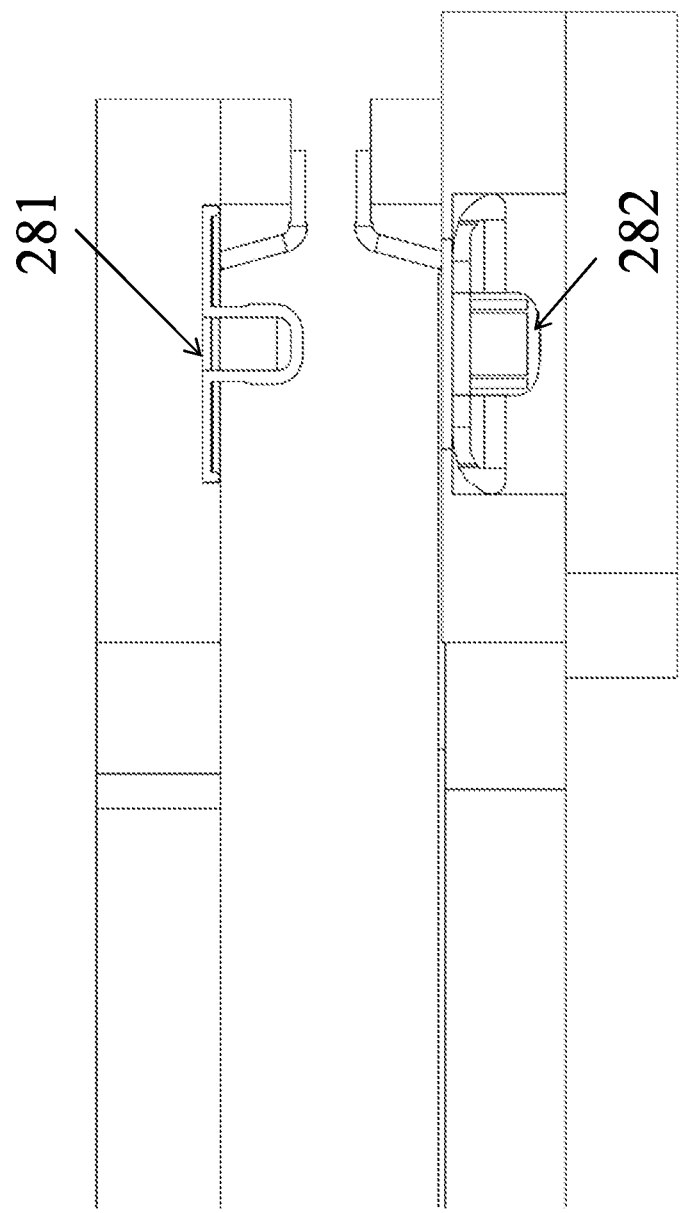
FIG. 2I shows an example of the Sew-on Snaps devices at the cross-section.

FIG. 2I shows an example of the Sew-on Snaps devices 281 and 282 at the cross-section. Sew-on Snaps can be made of different materials, including but not limited to metals.

Figure 2J:
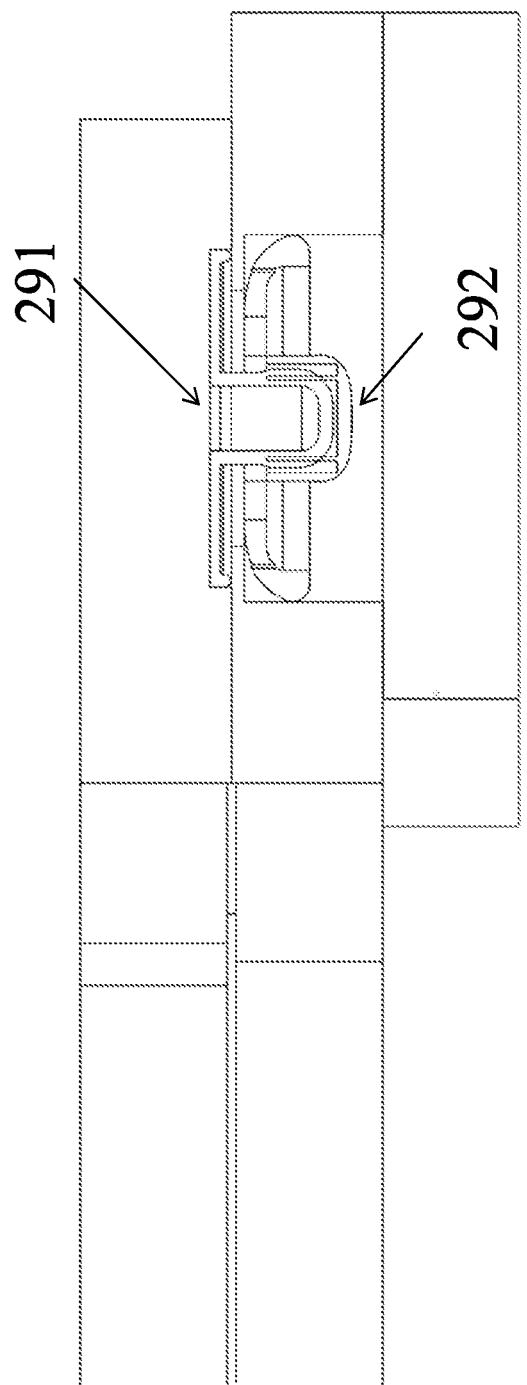
FIG. 2J shows an example of the Sew-on Snaps devices at the cross-section.

FIG. 2J shows an example of the Sew-on Snaps devices 291 and 292 at the cross-section. Sew-on Snaps can be made of different materials, including but not limited to metals.

During automatic substrate loading, substrates are placed by robot into pockets defined by the fingers. Another robot with top plate holding devices press top plates into the quick release buttons on the lower plates, and then releases the top plates. During substrate unloading, the top plates are removed by hand or by robot, or by other means with a griping device such as vacuum suction cup and then processed substrates are removed by robots and new substrates are mounted.

The above method allows deposition to the edges and sides of substrates. In cases no deposition on substrate edges and sides is desirable; the top plate can overlap with the substrate and shield the edge and sides from deposition.

Figure 3A:
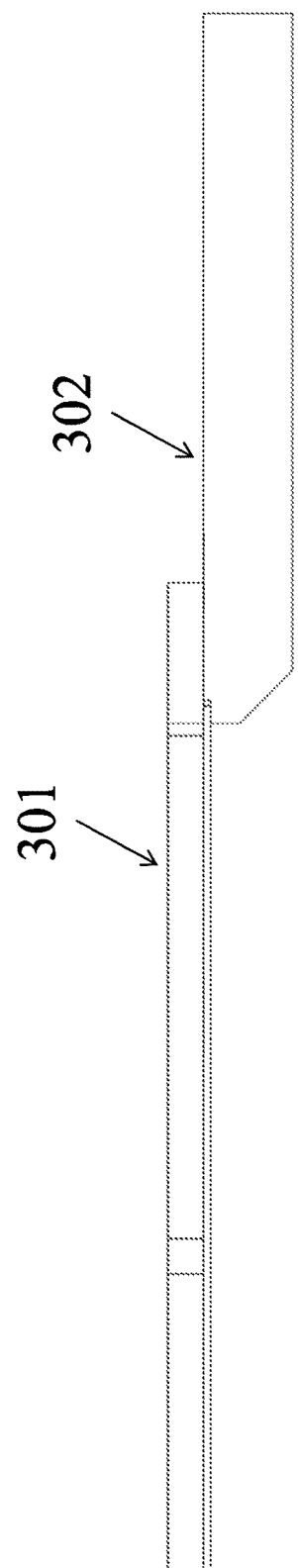
FIG. 3A show mask with both top surface and bottom surface of the substrate exposed.

FIG. 3A show mask with both top surface 301 and bottom surface 302 of the substrate exposed. Plates 301 can have the self-alignment devices.

Figure 3B:
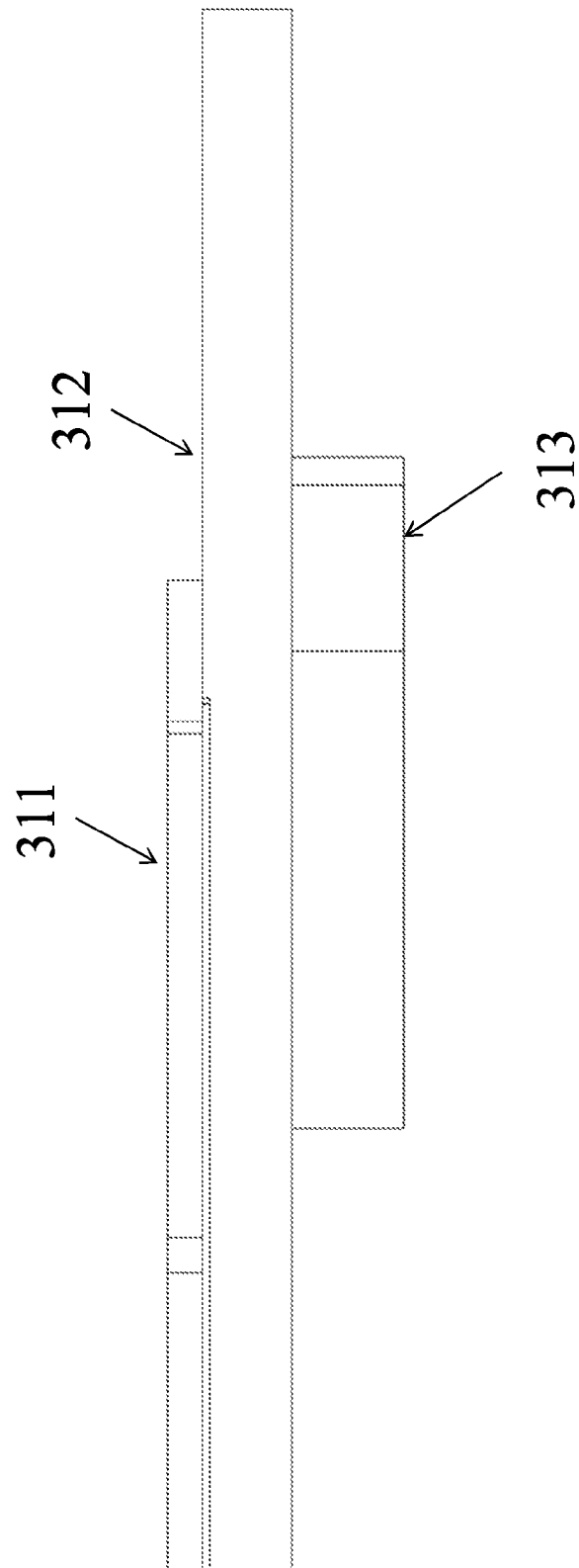
FIG. 3B shows if only one side of the substrate needs to be deposited; only one opening on either top plate or lower plate is necessary, as shown in FIG. 3B.

FIG. 3B shows if only one side of the substrate needs to be deposited; only one opening on either top plate 311 or lower plate 313 is necessary, as shown in FIG. 3B. The top plates 311 can have the self-alignment devices shown in FIG. 2I. The substrate 312 was secured in-between the top plate 311 and the lower plate 313.

Figure 3C:
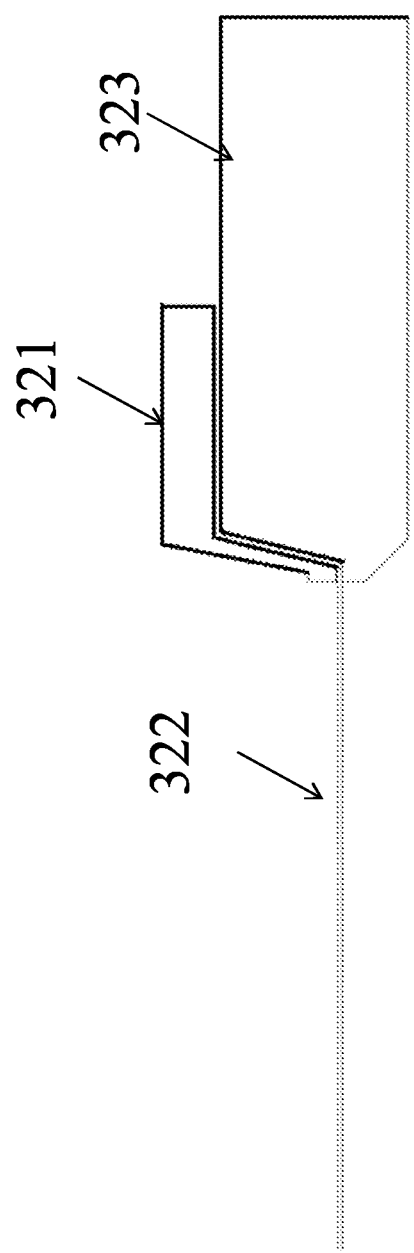
FIG. 3C shows the substrate self-alignment can also be accomplished by machining a slope on the lower plate and top plate.

In FIG. 3C, the substrate 322 self-alignment can also be accomplished by machining a slope on the lower plate 321 and top plate 323 as shown in FIG. 3C.

In some case, single side deposition without fingers touching substrate front surface is desirable. FIG. 4A shows a lower substrate carrier 403 with recess area to accommodate fingers 401 from top plate.

Figure 4B:
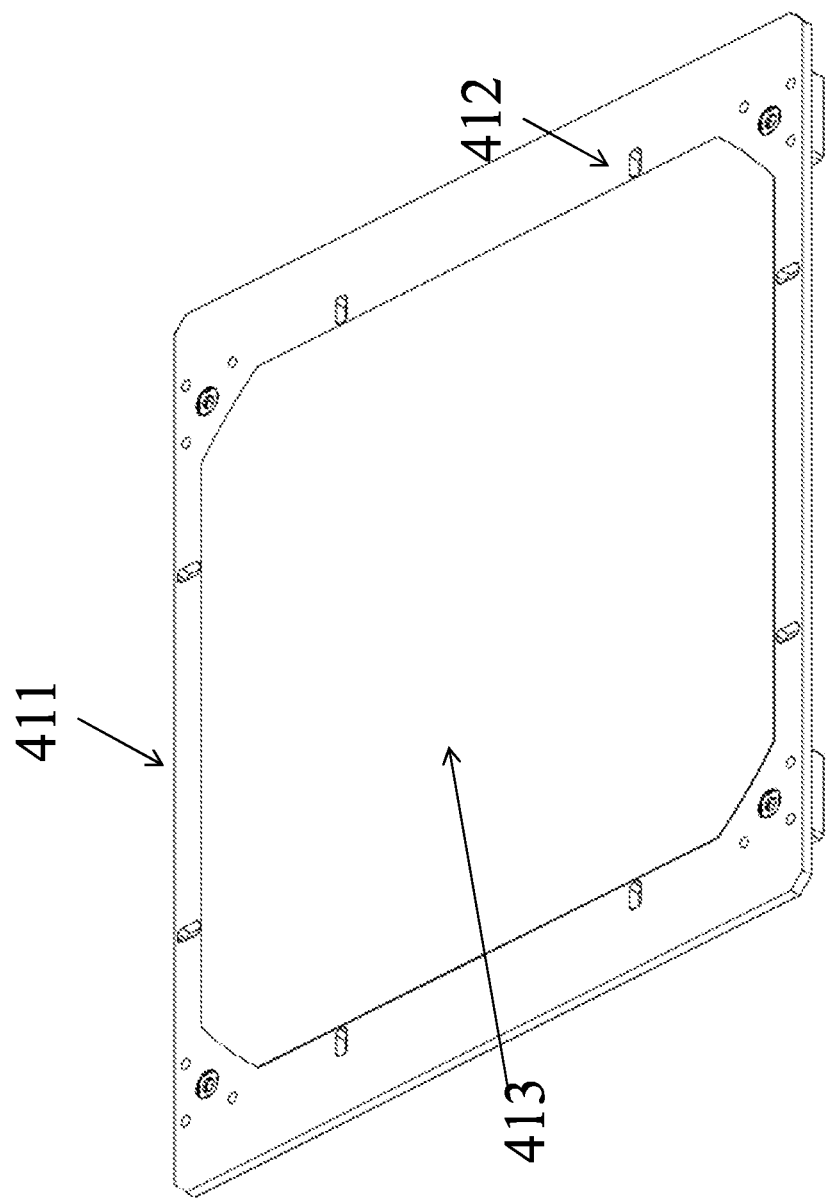
FIG. 4B shows the substrate placed on the lower substrate carrier.

FIG. 4B shows the substrate 413 placed on the lower substrate carrier 411.

Figure 4C:
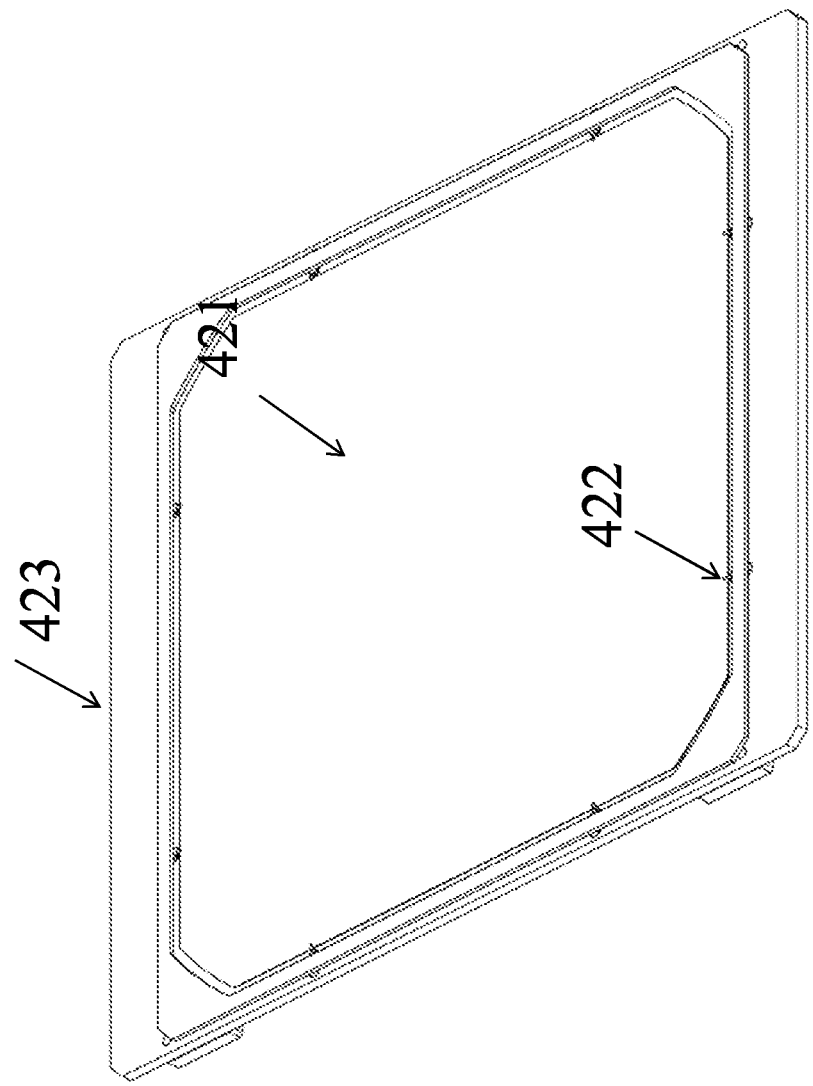
FIG. 4C shows a top plate with fingers holding the substrate.

FIG. 4C shows a top plate 423 with fingers 422 holding the substrate 421.

FIG. 4D shows a detailed view of top plate 433 with fingers 432 hold the substrate 431. The top plate is placed over the lower substrate carrier and pressed again the lower substrate carrier and becomes attached.

Figure 4E:
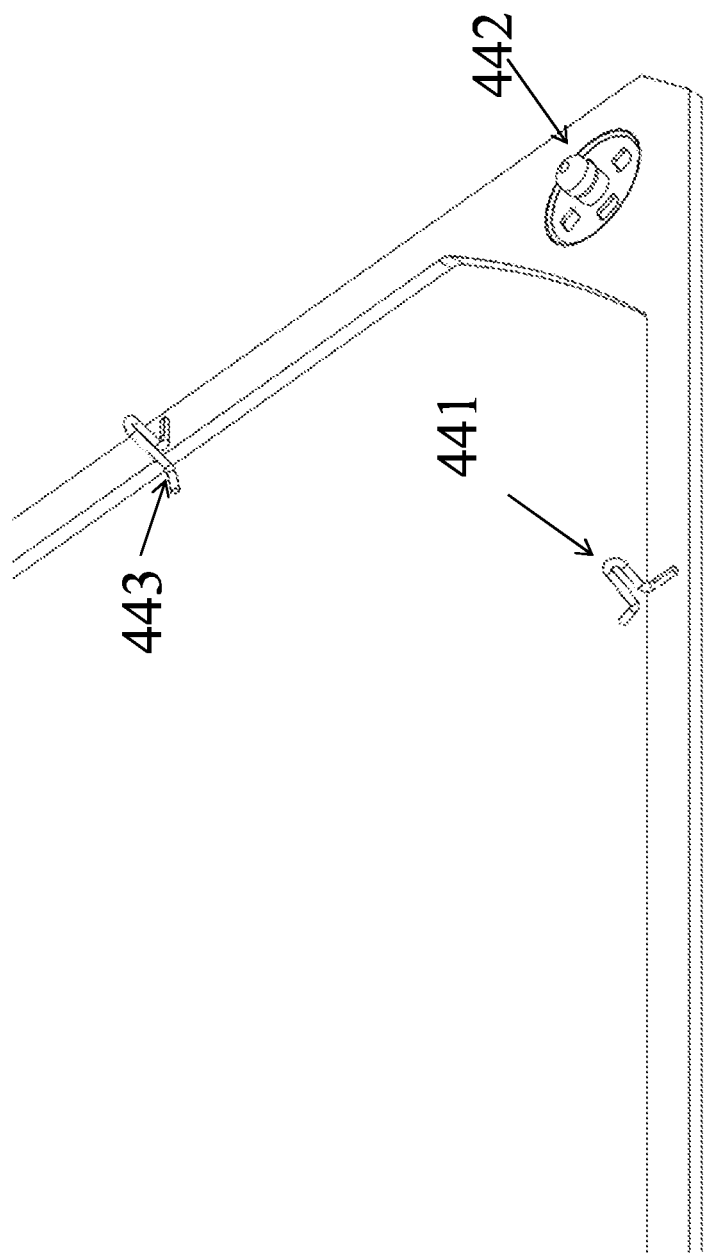
FIG. 4E shows the detailed bottom view of the top plate with fingers and Sew-on Snaps devices.
Figure 4F:
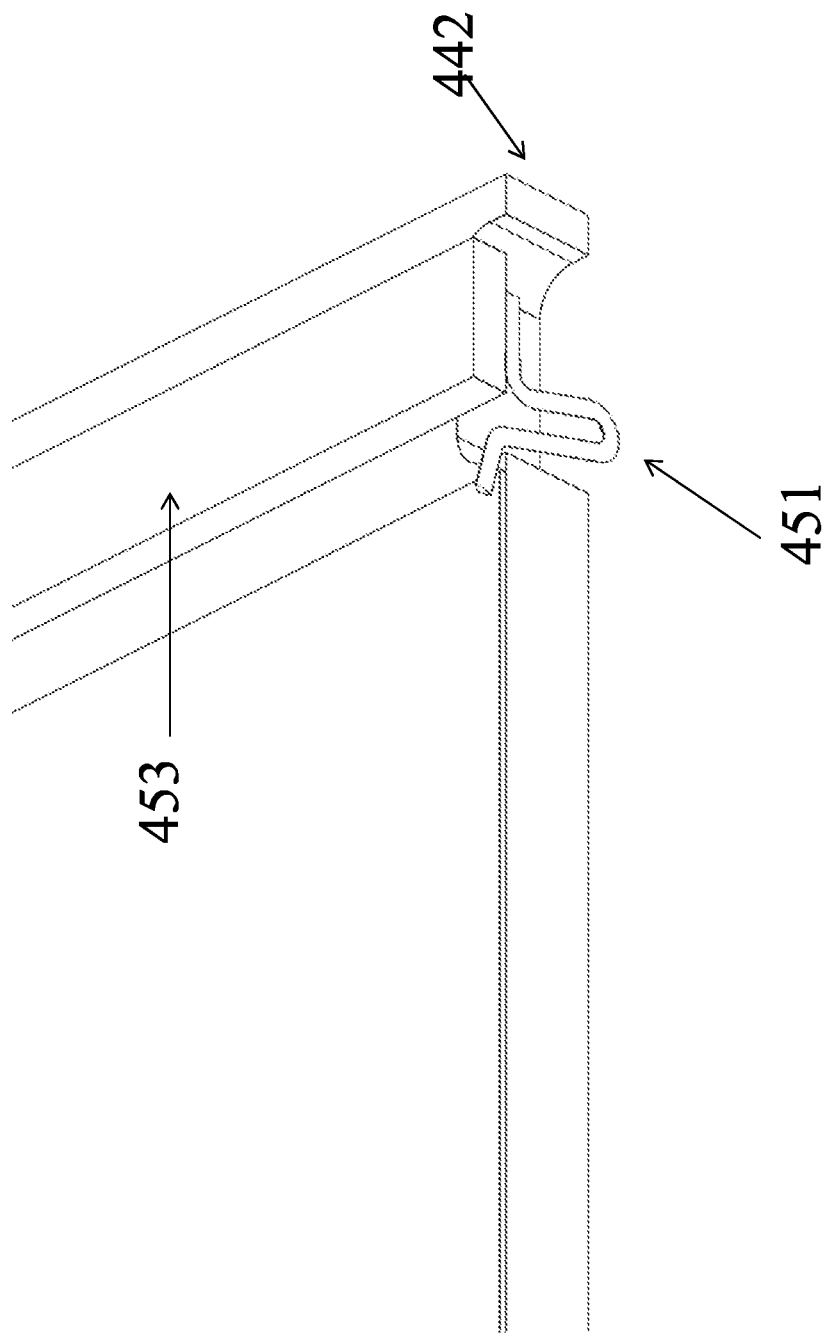
FIG. 4F shows the detail of fingers holding down the substrate on the substrate carrier.

FIG. 4E shows the detailed bottom view of the top plate with fingers 441 and 443. There is a Sew-on Snaps 442 within the plate. FIG. 4F shows the detailed section view of fingers holding down the substrate on the substrate carrier. The backside of the substrate is pushed against the lower substrate carrier and little if any deposition will occur on the backside of the substrate. The substrate is guided by the fingers 451 to its final position and held by the fingers. The substrate mounting is normally done while substrate carrier is placed in horizontal direction. The substrates can be orientated in any direction during handling and processing after mounting.

What is claimed is:

1. A substrate handling system, comprising:
a first planar panel with one or more openings, wherein the one or more openings has larger dimensions than one or more substrates, wherein the substrate is mounted on any of the one or more openings;
a first sets of fingers amounted on top side of the first planar panel, wherein the first sets of fingers point away from the substrate at an angle from zero to 60 degrees relative to the first planar panel, wherein the first sets of fingers are on edge of the one or more opening, wherein there is some space between the first sets of fingers and a depositing surface of the substrate, wherein the first sets of fingers make physical contact with edge of the substrate, wherein the depositing surface amounts to full surface of the substrate;
a second planar panel coupled to the first panel, wherein the second planar panel is situated over the one more substrates; and
a second sets of fingers amounted on bottom side of the second planar panel, wherein the second sets of fingers point away from the substrate at an angle from zero to 60 degrees relative to the second planar panel, wherein the first sets of fingers and the second sets of fingers form a cage that confines the one more substrates.

2. A substrate handling system, comprising:
a first planar panel with one or more openings, wherein the one or more openings has larger dimensions than a first substrate and a second substrate, wherein the first substrate and the second substrate are mounted on any one of the one or more openings, wherein the first substrate and the second substrate are placed back to back;
a first sets of fingers amounted on top side of the first planar panel, wherein the first sets of fingers point downwards at an angle relative to the first planar panel, wherein the first sets of fingers are on edge of the one or more opening, wherein there is some space between the first sets of fingers and outer surface of the first substrate, wherein the first sets of fingers make physical contact with edge of the substrate, wherein the outer surface amounts to full surface of the first substrate;
a second planar panel coupled to the first panel, wherein the second planar panel is situated underneath the second substrate; and
a second sets of fingers amounted on bottom side of the second planar panel, wherein the second sets of fingers point upwards at an angle relative to the second planar panel, wherein there is some space between the second sets of fingers and outer surface of the second substrate, wherein the first sets of fingers and the second sets of fingers form a cage that confines the first substrate and the second substrate.

* * * * *